United States Patent
Gabric et al.

(10) Patent No.: US 7,807,563 B2
(45) Date of Patent: Oct. 5, 2010

(54) METHOD FOR MANUFACTURING A LAYER ARRANGEMENT AND LAYER ARRANGEMENT

(75) Inventors: Zvonimir Gabric, Zorneding (DE); Werner Pamler, Munich (DE); Guenther Schindler, Munich (DE); Gernot Steinlesberger, Munich (DE); Andreas Stich, Gruenwald (DE); Martin Traving, Unterhaching (DE); Eugen Unger, Augsburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/786,770

(22) Filed: Apr. 12, 2007

(65) Prior Publication Data
US 2007/0246831 A1    Oct. 25, 2007

Related U.S. Application Data

(63) Continuation of application No. PCT/DE2005/001754, filed on Sep. 30, 2005.

(30) Foreign Application Priority Data
Oct. 15, 2004 (DE) .................. 10 2004 050 391

(51) Int. Cl.
*H01L 23/58* (2006.01)
(52) U.S. Cl. .................. 438/619; 257/760; 257/640
(58) Field of Classification Search ......... 438/619–622; 257/640, 760, 758
See application file for complete search history.

(56) References Cited

U.S. PATENT DOCUMENTS 5,067,673 A    11/1991 Fong
5,260,600 A    11/1993 Harada
5,407,860 A    4/1995 Stoltz et al.
5,759,913 A *  6/1998 Fulford et al. .............. 438/624
5,792,706 A *  8/1998 Michael et al. ............. 438/626
5,837,618 A *  11/1998 Avanzino et al. ........... 438/778
6,208,015 B1 * 3/2001 Bandyopadhyay et al. .. 257/635

(Continued)

FOREIGN PATENT DOCUMENTS

DE    4118165    12/1991

(Continued)

OTHER PUBLICATIONS

Arnal, V., et al., "Integration of a 3 Level Cu-SiO2 Air Gap Interconnect for Sub 0.1 micron CMOS Technologies," IEEE, 2001, 3 pages.

*Primary Examiner*—Steven Loke
*Assistant Examiner*—Kimberly M Thomas
(74) *Attorney, Agent, or Firm*—Slater & Matsil, L.L.P.

(57) ABSTRACT

In a method for manufacturing a layer arrangement, a plurality of electrically conductive structures are embedded in a substrate. Material of the substrate is removed at least between adjacent electrically conductive structures. An interlayer is formed on at least one portion of sidewalls of each of the electrically conductive structures. A first layer is formed on the interlayer where an upper partial region of the interlayer remaining free of a covering with the first layer. An electrically insulating second layer is formed selectively on that partial region of the interlayer which is free of the first layer, in such a way that the electrically insulating second layer bridges adjacent electrically conductive structures such that air gaps are formed between adjacent electrically conductive structures.

18 Claims, 8 Drawing Sheets

U.S. PATENT DOCUMENTS

| | | |
|---|---|---|
| 6,211,057 B1 | 4/2001 | Lin et al. |
| 6,399,476 B2 * | 6/2002 | Kim et al. .................. 438/619 |
| 6,423,629 B1 | 7/2002 | Ahn et al. |
| 6,440,839 B1 | 8/2002 | Partovi et al. |
| 6,445,072 B1 | 9/2002 | Subramanian et al. |
| 6,524,948 B2 | 2/2003 | Tamaoka et al. |
| 6,686,643 B2 | 2/2004 | Schwarzl et al. |
| 6,803,318 B1 | 10/2004 | Qiao et al. |
| 6,861,332 B2 | 3/2005 | Park et al. |
| 6,914,011 B2 | 7/2005 | Hayashide et al. |
| 7,033,926 B2 | 4/2006 | Schindler et al. |
| 7,071,091 B2 | 7/2006 | Clarke et al. |
| 2001/0019903 A1 | 9/2001 | Shufflebotham et al. |
| 2003/0176055 A1 | 9/2003 | Wu |
| 2003/0183940 A1 | 10/2003 | Noguchi et al. |
| 2004/0084749 A1 | 5/2004 | Pamler et al. |
| 2004/0124446 A1 | 7/2004 | Borger et al. |
| 2005/0012219 A1 * | 1/2005 | Liou .......................... 257/758 |
| 2005/0067673 A1 | 3/2005 | Geffken et al. |
| 2005/0074961 A1 * | 4/2005 | Beyer et al. .................. 438/619 |
| 2005/0079700 A1 | 4/2005 | Schindler et al. |
| 2006/0057835 A1 | 3/2006 | Anderson et al. |
| 2006/0084236 A1 | 4/2006 | Vogt |
| 2006/0105581 A1 | 5/2006 | Bielefeld et al. |

FOREIGN PATENT DOCUMENTS

| | | |
|---|---|---|
| DE | 199 57 302 A1 | 5/2001 |
| DE | 10109778 | 9/2002 |
| DE | 101 25 019 A1 | 12/2002 |
| DE | 101 40 754 A1 | 3/2003 |
| DE | 102 46 830 A1 | 2/2004 |
| DE | 103 41 544 A1 | 4/2005 |
| DE | 10 2004 003 337 A1 | 8/2005 |
| JP | 06-216122 | 8/1994 |
| WO | WO 02/095820 A2 | 11/2002 |
| WO | WO 03/019649 | 3/2003 |
| WO | WO 03/102264 A2 | 12/2003 |
| WO | WO 2005/071739 A2 | 8/2005 |

* cited by examiner

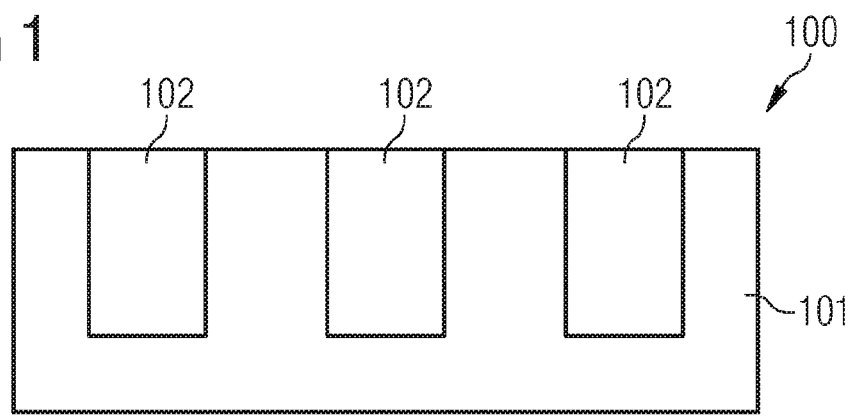
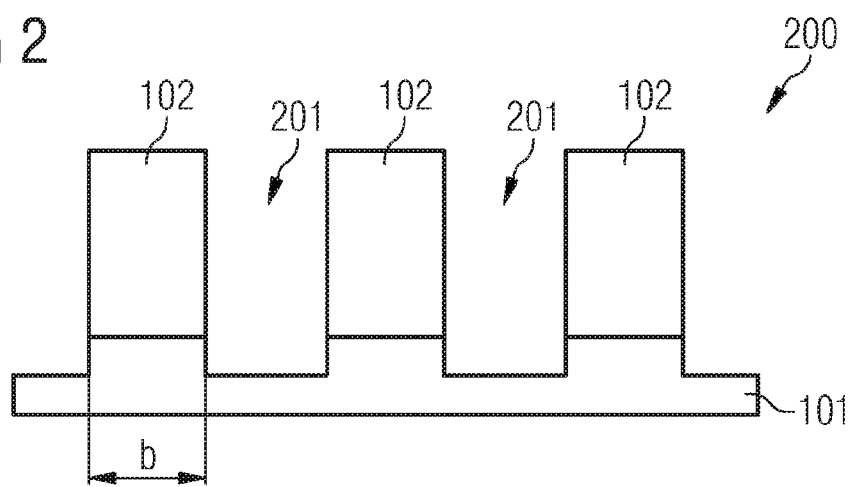
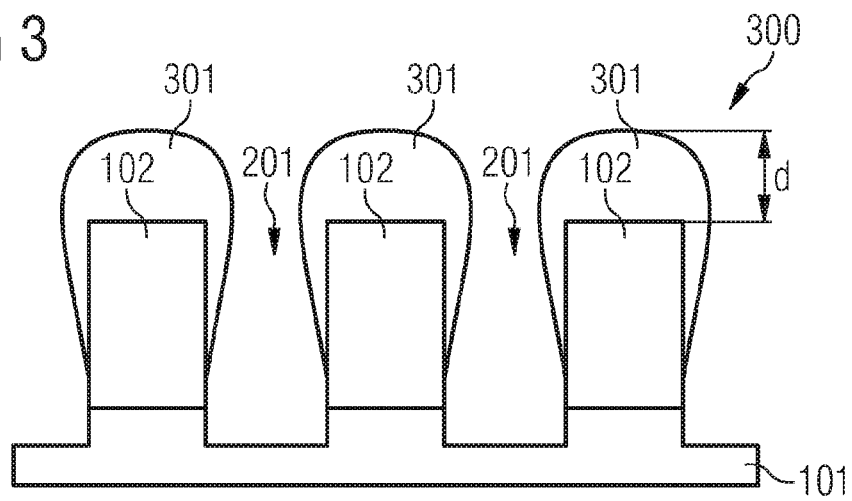

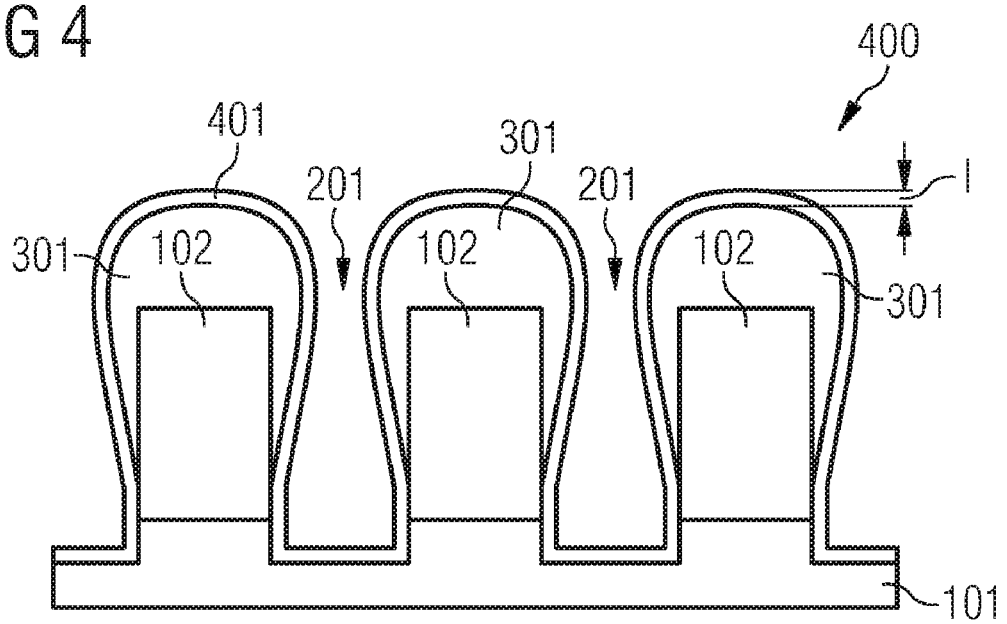
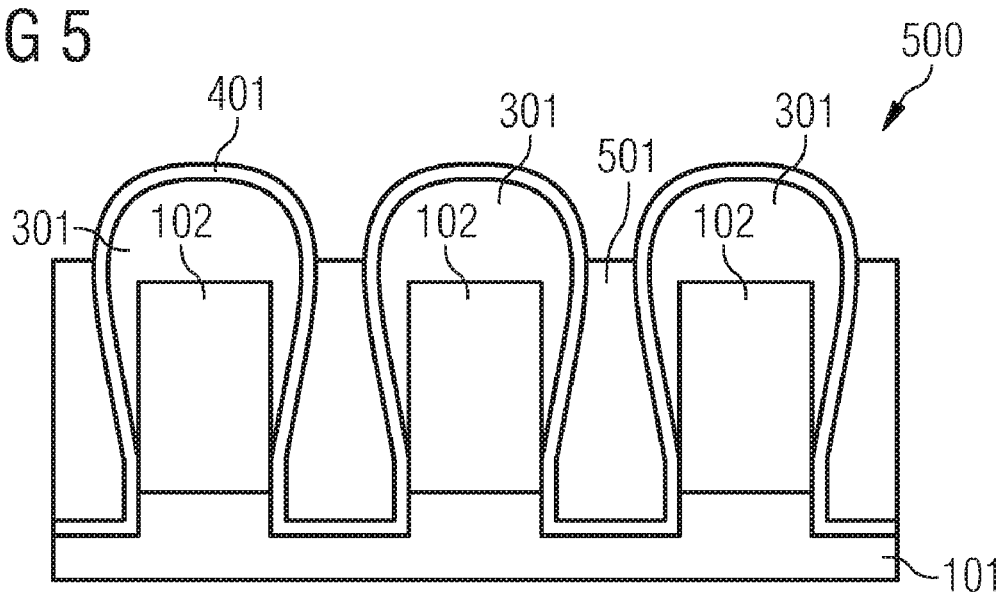

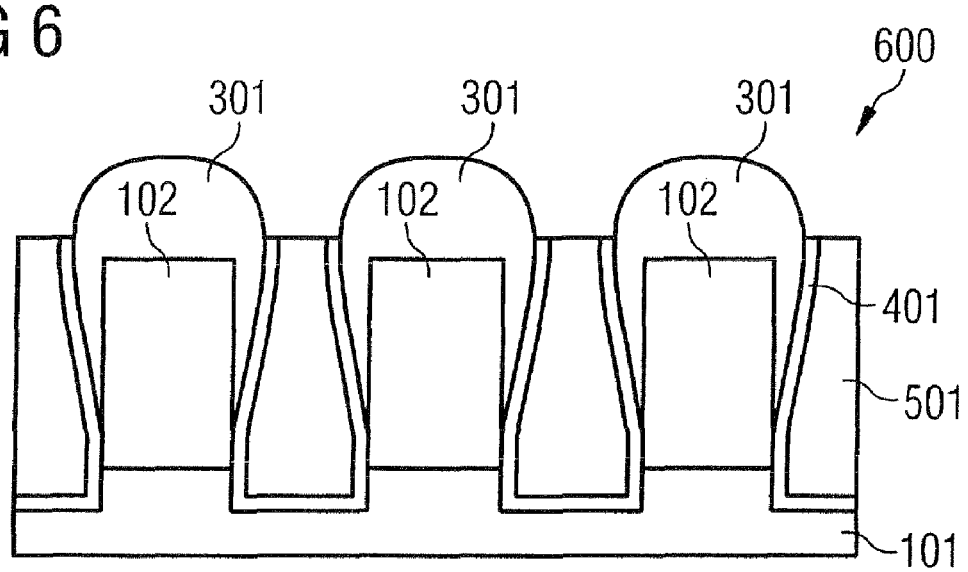
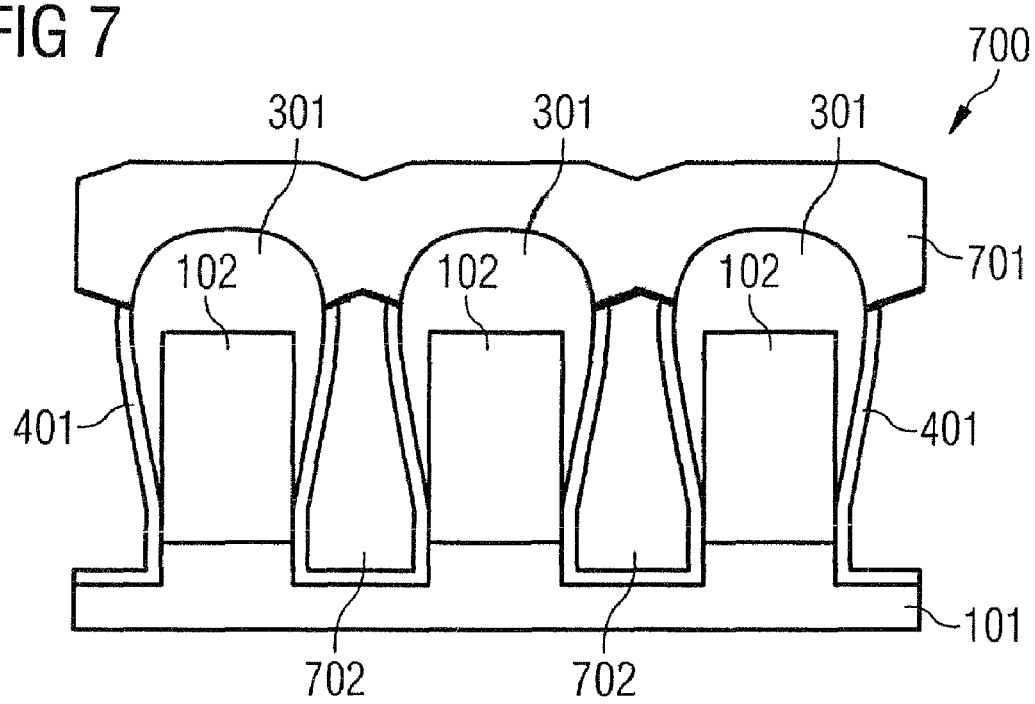

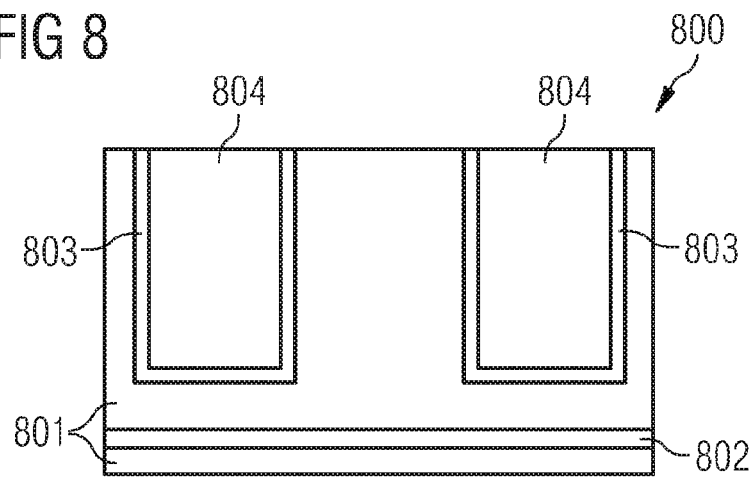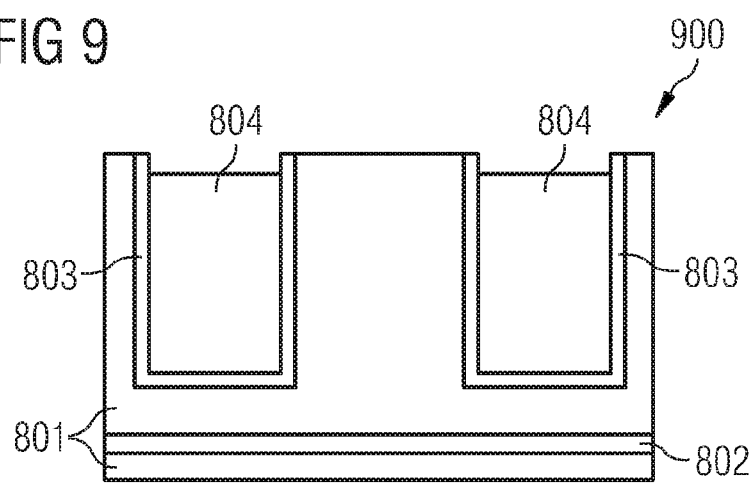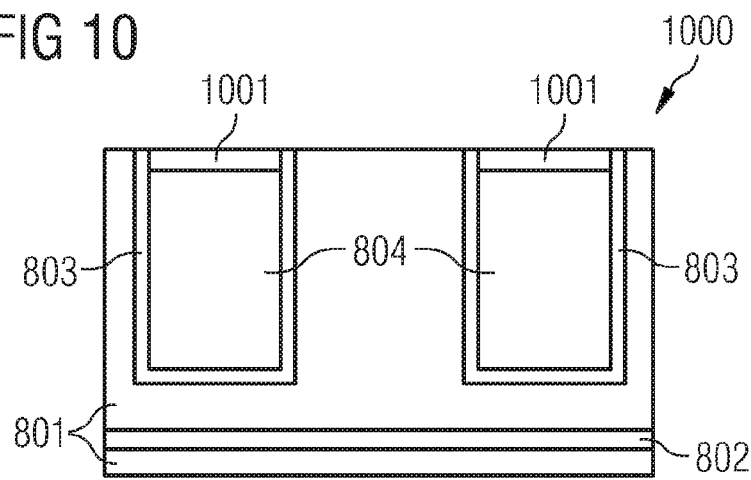

METHOD FOR MANUFACTURING A LAYER ARRANGEMENT AND LAYER ARRANGEMENT

This application is a continuation of co-pending International Application No. PCT/DE2005/001754, filed Sep. 30, 2005, which designated the United States and was not published in English, and which is based on German Application No. 10 2004 050 391.5 filed Oct. 15, 2004, both of which applications are incorporated herein by reference.

TECHNICAL FIELD

The invention relates to a method for manufacturing a layer arrangement and a layer arrangement.

BACKGROUND

Integrated circuit arrangements are produced with an ever higher packing density. The consequence of this is that interconnects in metallization levels are at an ever smaller distance from one another. As a result, capacitances formed between the interconnects rise and lead to high signal propagation times, high power loss and undesirable crosstalk, that is to say to an interaction between signals applied on adjacent interconnects.

Silicon oxide has a dielectric whose relative permittivity $\in_r = 3.9$ is often used as insulation material between the interconnects.

In order to reduce the relative permittivity $\in_r$, which leads to a reduction of the value of the coupling capacitances between interconnects embedded into an insulation material, use is made of so-called low-k materials, that is to say materials having a low value $\in_r$ as material for intermetal dielectrics.

It is also known from the prior art to produce cavities between interconnects within an interconnect level in order to reduce the value of the relative permittivity and thus the value of the coupling capacitance. The insulating dielectric that determines the capacitance between the interconnects has a relative permittivity $\in_r$ which is approximately equal to one in the region of cavities. The interconnects themselves are surrounded by a material layer composed of silicon oxide or a low-k material for the purpose of decoupling from the surroundings.

The high coupling capacitances C between adjacent interconnects, which are becoming greater and greater in increasingly miniaturized circuits, lead, together with the resistance R of an interconnect, to an RC switching delay of signals transported on the interconnects. The RC switching delay can be reduced using air gaps as an alternative to low-k materials since the effective dielectric constant $\in_r$ as insulation material between metallization tracks is considerably reduced when air gaps are used between interconnects. One possibility for the realization of air gaps is disclosed in, Arnal, V., et al., "Integration of a 3 Level Cu—SiO$_2$ Air Gap Interconnect for Sub 0.1 micron CMOS Technologies", Proceedings IITC 2001 (hereinafter "Arnal"), for example.

Consequently, air gaps can be used for reducing the parasitic capacitance between metal tracks. However, a series of problems arise in the production of air gaps. Air gaps can be produced by means of a non-conformal deposition of a dielectric onto the metal tracks, interspaces between adjacent interconnects partly remaining free of material. The air gaps are extended in very long fashion as a result, however. As a result, there is the risk of a conflict with an overlying metallization level, for example when opening the air gaps in a CMP method step ("chemical mechanical polishing"), see Arnal.

Furthermore, there is a problem with air gap structures in accordance with the prior art in that during the formation of a dielectric cover layer for covering interconnects, dielectric material can pass into regions between adjacent interconnects in an undesirable manner, that is to say can fill air gaps, which runs counter to the formation of an intermetal dielectric having a low k value.

DE 101 25 019 A1 discloses a cavity structure in which interconnects are formed as laterally delimited layer sequences on the surface of a substrate and are covered with a cover layer such that cavities are formed between adjacent interconnects.

DE 102 46 830 A1 describes a method for copper metallization, wherein uncovered regions between copper interconnects are filled with an insulator layer, wherein voids form in the insulator layer in the filled regions between the copper interconnects.

U.S. Pat. No. 6,524,948 B2 describes a semiconductor device and a method for producing the same, wherein firstly, by means of an etching step, trenches extending through a first layer, which essentially comprises insulating material, and an underlying second layer comprising conductive material are formed in such a way that a conductor structure with interspaces forms in the second layer, and an insulating layer is subsequently formed over the first and second layers in such a way that air gaps form in the interspaces.

SUMMARY OF THE INVENTION

Embodiments of the invention are based on the problem of providing an alternative layer arrangement having air gaps between adjacent interconnects in which undesirable filling of air gaps with dielectric material during the application of a cover layer that covers the interconnects is reliably avoided.

This problem can be solved by means of a method for manufacturing a layer arrangement and by means of a layer arrangement having the features in accordance with the independent patent claims.

In one embodiment for manufacturing a layer arrangement, a plurality of electrically conductive structures are embedded in a substrate, a first layer is formed on at least one portion of the sidewalls of each of the electrically conductive structures, an upper partial region of the electrically conductive structures remaining free of a covering with the first layer. Material of the substrate is removed at least between adjacent electrically conductive structures such that air gaps are formed between adjacent electrically conductive structures, and an electrically insulating second layer is formed selectively on that partial region of the electrically conductive structures that is free of the first layer, in such a way that the electrically insulating second layer bridges adjacent electrically conductive structures.

Furthermore, embodiments of the invention provide a layer arrangement, including a substrate, a plurality of electrically conductive structures embedded in the substrate, and including a first layer on at least one portion of the sidewalls of each of the electrically conductive structures, an upper partial region of the electrically conductive structures being free of a covering with the first layer.

One exemplary idea of the invention can be seen in providing only a region near the substrate (i.e., at least one portion of the sidewalls), but not a region remote from the substrate (i.e., an upper partial region), of electrically conductive structures (for example, interconnects of an integrated circuit) with a dielectric protective layer (first layer), on which afterward a deposition of a cover layer (electrically insulating second layer) is not possible. Such a deposition of the cover layer is possible only on a surface region of the electrically conductive structures which is free of the material of the dielectric protective layer (or on a dielectric interlayer formed thereon). By means of defining that region of the (preferably laterally delimited) electrically conductive structures on which the protective layer is formed, that is to say by means of defining the height at vertical sidewalls of the electrically conductive structures up to which the protective layer extends, it is possible to predetermine the regions of the surface of the resulting layer sequence in which the cover layer can subsequently be deposited and the regions on which said cover layer cannot subsequently be deposited.

The electrically conductive structures are embedded into a matrix composed of substrate material, that is to say are formed therein and not only thereon.

This may be effected, for example, by means of forming interconnects (in particular copper interconnects) by means of a damascene method. The first layer can then be formed at the sidewalls of trenches formed for this purpose, before material for forming the electrically conductive structures is deposited thereon.

It is also possible firstly to form laterally delimited electrically conductive structures formed on a carrier material, to coat them completely with an auxiliary layer, then to embed the coated electrically conductive structures into an auxiliary matrix, to remove regions of the auxiliary layer which project from the auxiliary matrix, and subsequently to remove the auxiliary matrix, whereby the electrically conductive structures remain covered only in a lower region with the residual regions of the auxiliary layer that form the first layer.

According to the invention, material of the cover layer is deposited selectively only on those surface regions of the layer sequence which are free of the protective layer (first layer). If that surface region of the layer sequence which is remote from the substrate and is free of the protective layer is shifted far enough toward the top, then after the formation of the cover layer a region between adjacent interconnects that are covered with the thin protective layer remains largely free of dielectric material, whereby air gaps are formed. As a result, an interconnect arrangement having a low value of the dielectric constant is obtained in which parasitic capacitances are low owing to the provision of the air gaps and good shielding and reliable protection against mechanical damage of the sensitive interconnect-air gap structures is achieved owing to the cover layer. An undesirable projection of the cover layer into air gap regions is simultaneously avoided owing to the selectivity of the deposition method for forming the electrically insulating second layer.

To put it another way, one important aspect of the invention consists in applying a first (electrically insulating or electrically conductive) layer as a protective layer on the sidewalls of the electrically conductive structures, in which case material of an electrically insulating second layer can be deposited only very poorly or not at all on material of the first layer.

Consequently, one important aspect of the invention can be seen in the coverage of laterally structured interconnects with a dielectric protective layer on a partial region of the layer sequence that is near the substrate, a partial region of the layer sequence which is remote from the substrate remaining free of a covering with the protective layer, followed by a subsequent closure of air gaps between adjacent interconnects by means of the selective deposition of a cover layer on partial regions of the layer sequence which are remote from the substrate and are free of the first layer. Self-aligned air gaps can be produced in this way.

A self-aligned closing of air gaps is made possible by clearing out a selective deposition. For this purpose, by way of example, a silicon-oxygen-nitrogen-containing material formed by means of a plasma-enhanced chemical vapor deposition method, silicon nitride or titanium nitride may be used as material for the first layer, and silicon oxide formed on the basis of tetraethyl orthosilicate (TEOS) decomposed in an ozone-activated manner may be used as the cover layer. Given this exemplary material combination, virtually no material of the cover layer is deposited on the material of the first layer.

Clearly, one preferred exemplary embodiment of the present invention is based on a combination of conformal, non-conformal and selective deposition, technological problems on account of raised tips for closing air gaps being avoided. Furthermore, the number of lithography steps required is small according to the invention. Owing to the combination of non-conformal and selective deposition, the etched-back photoresist defines regions on which a selective deposition is to be effected.

Preferred developments of the invention emerge from the dependent claims.

Configurations of the method according to an embodiment of the invention for manufacturing a layer arrangement are described below. These configurations also apply to the layer arrangement, and vice versa.

Prior to forming the first layer, it is possible to form a third layer on the plurality of electrically conductive structures, the electrically insulating second layer then being formed selectively on that surface region of the third layer which is free of the first layer (and not directly on the electrically conductive structures covered with the third layer). In accordance with this configuration, a dielectric or electrically conductive interlayer is therefore formed between the electrically conductive structures and the first layer, in which case the cover layer is grown selectively on the material of the third layer in accordance with this configuration.

The plurality of electrically conductive structures may be formed by forming trenches in the substrate and introducing electrically conductive material into the trenches. In accordance with these so-called damascene methods, it is possible to form interconnects composed of copper material.

Material of the substrate between the electrically conductive structures may be removed in such a way that the air gaps extend in the substrate as far as below the electrically conductive structures. Clearly, in accordance with this configuration, the air gaps extend into the substrate deeper than the interconnects. A structure having a particularly low value of the relative permittivity $\varepsilon_r$ is therefore achieved with this configuration.

The third layer may be formed by means of a non-conformal deposition method, that is to say using a deposition method in which the thickness and/or the quality of the third layer is not necessarily constant over the entire layer sequence. A conformal deposition method is not absolutely necessary for forming the third layer.

By contrast, the first layer is preferably formed by means of a conformal deposition method, with the result that the first layer then has a constant thickness over the entire layer sequence. This avoids a situation in which (for example, dielectric) material applied to the electrically conductive structures with an uncontrolled thickness possibly closes or fills air gaps between adjacent interconnects in an undesirable manner.

The first layer is preferably formed by forming material on all the electrically conductive structures or, if this optional layer is provided, on the entire third layer, forming sacrificial material on a partial region of the material, subsequently removing material not covered by the sacrificial material, and then removing the sacrificial material.

This configuration is advantageous in order to form the first layer only in a surface region of the layer sequence which faces the substrate. For this purpose, firstly a layer composed of dielectric or electrically conductive material is deposited over the whole area on the surface of the layer sequence and then trenches between adjacent layer sequences, covered with the previously deposited material, are filled, for example, with photoresist as sacrificial material up to a predetermined height. The height of the deposition of the sacrificial layer then determines which partial region between the adjacent interconnects is later covered by the first layer and will therefore remain free of a covering with material of the cover layer. The photoresist then serves as a mask for the removal of uncovered regions of the previously deposited material that are remote from the substrate, regions of the previously deposited material that are covered with photoresist material not being removed by such an etching process. After uncovered regions of the previously deposited material have been removed, the sacrificial material is removed, with the result that partial regions of the previously deposited material that were previously covered with sacrificial material are uncovered, whereby the first layer remains. If an electrically insulating second layer is then deposited as cover layer, those surface regions of the layer sequence which are covered with material of the first layer remain free of material of the electrically insulating second layer owing to the selectivity of the deposition method.

The first layer may be formed by means of a plasma-enhanced chemical vapor deposition method for forming a silicon-oxygen-nitrogen-containing material, in which case, during the supply of silicon material and oxygen material, nitrogen material is supplied using an organic silicon precursor material.

In accordance with this configuration of the invention with regard to the material of the first (electrically insulating in accordance with this configuration) layer, a manufacturing method for a silicon-oxygen-nitrogen-containing material is provided in the context of the layer arrangement according to the invention, by which method a material is obtained which predominantly contains silicon-oxygen components and therefore has a relative permittivity that is similarly low to that of silicon oxide ($\epsilon_r = 3.9$). The silicon-oxygen-nitrogen-containing material produced in accordance with this plasma-enhanced chemical vapor deposition method additionally contains small quantities of nitrogen (preferably in the single-digit percentage range). The nitrogen component of the silicon-oxygen-nitrogen-containing material produced by means of the method according to an embodiment of the invention clearly brings about silicon-nitride-like properties with regard to the depositability of ozone/TEOS (preferred material for the electrically insulating second layer) thereon. To put it another way, the material of the first layer in accordance with this configuration is very poorly suited to enabling the deposition of ozone/TEOS (preferred material of the electrically insulating second layer) thereon. The combination of a low k value and a low tendency to serve as a carrier for the deposition of ozone/TEOS brings about an outstanding suitability of the material as intermetal dielectric and hence as a first layer of an integrated circuit comprising air gap structures.

To put it another way, this material essentially has the favorable dielectric properties of silicon oxide (that is to say a low value of the relative permittivity and hence a low RC switching delay), and the material composition (probably in particular the nitrogen component therein) simultaneously has the effect that the material formed on the basis of an organic precursor has material properties that are rather similar to silicon nitride with regard to the selective deposition of ozone/TEOS.

This material of the first layer allows a material based on silicon oxide to be used instead of silicon nitride as material between air gaps, without losing the advantages of selective deposition.

This material is produced by additionally introducing, apart from an organic silicon precursor material as source for the silicon component and the oxygen component of the material according to the invention, nitrogen material into the PECVD method chamber ("plasma enhanced chemical vapor deposition"), whereby the material is obtained. When this method is used, small quantities of nitrogen are clearly incorporated into a matrix that is essentially based on silicon oxide material.

Silicon oxide is often deposited by means of a plasma-enhanced TEOS process (so-called "PE-TEOS"). On the basis of the observation that no or only very little ozone/TEOS deposition takes place on silicon nitride, nitrogen is then added to the PE-TEOS process. The incorporation of small quantities of nitrogen, typically in the percentage range, makes it possible to greatly increase the selectivity of the ozone/TEOS deposition, with the result that, in a manner similar to that in the case of silicon nitride, no or only extremely little deposition of ozone/TEOS takes place on the layer. The properties of silicon oxide are simultaneously largely maintained. The effective dielectric constant of an air gap structure with the modified PE-TEOS decreases, depending on geometry, in comparison with the variants with silicon nitride from values in the region of three to values of around two.

The silicon-oxide-containing layers with incorporated nitrogen material which are produced in accordance with the configuration described typically have a refractive index of $n=1.5$, whereas silicon oxide produced by means of thermal oxidation has a refractive index of 1.45. The nitrogen content of the material according to an embodiment of the invention is typically in the atomic percent range. A deposition of ozone/TEOS does not take place, or takes place only very poorly, on this type of silicon oxide provided with small quantities of nitrogen.

In order to achieve the advantageous material properties of this material, it is possible to use an organic (that is to say based on carbon compounds) silicon precursor material, preferably tetraethyl orthosilicate (TEOS). With the inorganic material silane ($SiH_4$), for example, it is not possible to obtain the material with the advantageous properties.

The plasma-enhanced chemical vapor deposition method (PECVD) used for forming the material preferred for the first layer is a special technique within the general CVD method ("chemical vapor deposition").

The CVD method is a coating technology for depositing thin layers from the vapor phase on a solid substrate. The principle of the CVD method consists in conducting gaseous starting materials, so-called precursors, over a substrate and chemically decomposing them into their constituents, whereby a new layer grows on the substrate surface. The precursors are usually decomposed thermally, that is to say by means of heating the substrate. The actual deposition takes place with the involvement of a chemical reaction. By way of example, a volatile gaseous component reacts with another gas to form a solid material that is deposited on the substrate. However, the process temperatures are relatively high in the CVD method.

The plasma-enhanced chemical vapor deposition method (PECVD) can be carried out at significantly lower process temperatures. While in a CVD process the vapor phase reaction is initiated by thermal energy on account of heating of the substrate, the PECVD method is based on converting a gas into the plasma state in the vicinity of the substrate surface. In this case, one of the reaction products is a solid substance that deposits on the surface, whereby a new layer composed of the material according to an embodiment of the invention is formed. In a PECVD reactor, a plasma is ignited between the substrate holder, which serves as one electrode, and a further electrode by means of a strong alternating electric field. By means of the energy of the field, bonds between the gas molecules introduced into the PECVD reactor are broken and the gas molecules are decomposed.

An oxygen-containing material is preferably used as organic silicon precursor material. Said oxygen-containing material may serve as an oxygen source for forming the silicon-oxygen-nitrogen-containing material according to the invention.

It is particularly favorable to use tetraethyl orthosilicate (TEOS), that is to say $(C_2H_5O)_4Si$, as organic silicon precursor material. This material constitutes, in a particularly favorable manner, a silicon source and an oxygen source for the silicon-oxygen-nitrogen-containing material which is formed according to the invention and into which is incorporated nitrogen material introduced simultaneously on account of the chemical processes during the decomposition of the TEOS material.

As an alternative, in the context of the invention, the following materials, for example, may be used as organic silicon precursor material: methyltriethoxysilane (MTrEOS), dimethyldiethoxysilane (DMDEOS), trimethylethoxysilane (TrMEOS) and/or tetramethylsilane (TMS).

In the case of the layer arrangement according to an embodiment of the invention, the interlayer, that is to say the third (electrically insulating in accordance with this configuration) layer, may be formed from silane-based ($SiH_4$) silicon oxide. If a cover layer, that is to say the second electrically insulating layer, is then selectively deposited from silicon oxide that is formed on the basis of tetraethyl orthosilicate decomposed in an ozone-activated manner, then a layer arrangement is obtained which is reliably closed off toward the outside since the material of the cover layer can clearly overgrow a trench of the layer arrangement. Simultaneously, on account of the material combination, the situation is avoided in which the trench is partly filled with cover layer material during the growth of such a cover layer, which results from the poor depositability of the material of the cover layer on the material according to the invention within the trench.

It should be noted that the precise process parameters for producing the material according to the invention depend on the process chamber, etc.

Consequently, in the method, the electrically insulating second layer may be formed from silicon oxide that is formed on the basis of tetraethyl orthosilicate decomposed in an ozone-activated manner. Such a material can advantageously be combined in particular in combination with the preferred materials described above for the first layer and for the third layer, since it has selective decomposition properties desired according to the invention with respect to said materials with regard to the deposition method.

The plurality of electrically conductive structures may be formed by forming trenches in the substrate, forming the first layer at least on the sidewalls of the trenches, and filling the trenches provided with the first layer on the sidewalls with electrically conductive material. In accordance with this configuration, therefore, firstly the first layer is formed in trenches before the electrically conductive material is deposited on the layer at sidewalls of the trench.

Prior to filling with electrically conductive material, the inner area of the trenches provided with the first layer on the sidewalls may be covered with a fourth layer. Such a fourth layer may be provided as a barrier layer between the material of the electrically conductive structures and the material of the first layer, for example, composed of Ta or Ta/TaN.

A fifth layer may be formed on the electrically conductive material, the electrically insulating second layer being formed selectively on said fifth layer. Such a fifth layer may, in particular, not be formed on (vertical) sidewalls but rather only on an upper (horizontal) cover area.

The fifth layer may be formed from tantalum, tantalum nitride or titanium. These materials have the advantageous property for an embodiment of the invention that silicon oxide formed on the basis of tetraethyl orthosilicate decomposed in an ozone-activated manner, in particular, can be deposited well on them, said silicon oxide preferably being used as a material for the electrically insulating second layer.

In the method, a buried layer may be formed in the substrate, said buried layer forming a stop layer during the removal of material of the substrate. If such a buried layer is formed below the electrically conductive structures in the substrate, then it is possible, during the later removal of regions between adjacent electrically conductive structures, to remove material by means of etching, for example, until the etching front reaches the stop layer. If the etching method is chosen in selective fashion, such that material between adjacent electrically conductive structures is etched whereas material of the stop layer is not etched, then the stop layer may serve as an etching stop layer and therefore form a structural limit for the depth of the air gaps formed.

Configurations of the layer arrangement according to an embodiment of the invention are described below. Configurations of the layer arrangement also apply to the method for producing a layer arrangement, and vice versa.

The electrically conductive structures may be interconnects. To put it another way, the layer arrangement may be part of a monolithic circuit that may be fabricated using a technology in silicon microelectronics, by way of example.

The layer arrangement may have a third layer between the plurality of electrically conductive structures and the first layer, the electrically insulating second layer then being formed selectively on that partial region of the third layer which is free of the first layer.

In the layer arrangement, a buried layer may be formed in the substrate, said buried layer being set up as a stop layer for removal of material of the substrate. If such a buried layer is formed below the electrically conductive structures in the substrate, then it is possible, during a removal of regions between adjacent electrically conductive structures, to remove material by means of etching, for example, until the etching front reaches the stop layer. If the etching method is chosen in selective fashion, such that material between adjacent electrically conductive structures is etched whereas material of the stop layer is not etched, then the stop layer may serve as an etching stop layer and therefore form a structural limit for the depth of the air gaps formed.

BRIEF DESCRIPTION OF THE DRAWINGS

Exemplary embodiments of the invention are illustrated in the figures and are explained in more detail below. In the figures:

FIG. 1 shows a layer sequence at a first point in time during a method for manufacturing a layer arrangement in accordance with a first exemplary embodiment of the invention;

FIG. 2 shows a layer sequence at a second point in time during a method for manufacturing a layer arrangement in accordance with the first exemplary embodiment of the invention;

FIG. 3 shows a layer sequence at a third point in time during a method for manufacturing a layer arrangement in accordance with the first exemplary embodiment of the invention;

FIG. 4 shows a layer sequence at a fourth point in time during a method for manufacturing a layer arrangement in accordance with the first exemplary embodiment of the invention;

FIG. 5 shows a layer sequence at a fifth point in time during a method for manufacturing a layer arrangement in accordance with the first exemplary embodiment of the invention;

FIG. 6 shows a layer sequence at a sixth point in time during a method for manufacturing a layer arrangement in accordance with the first exemplary embodiment of the invention;

FIG. 7 shows a layer arrangement manufactured by the method in accordance with the first exemplary embodiment of the invention;

FIG. 8 shows a layer sequence at a first point in time during a method for manufacturing a layer arrangement in accordance with a second exemplary embodiment of the invention;

FIG. 9 shows a layer sequence at a second point in time during a method for manufacturing a layer arrangement in accordance with the second exemplary embodiment of the invention;

FIG. 10 shows a layer sequence at a third point in time during a method for manufacturing a layer arrangement in accordance with the second exemplary embodiment of the invention;

DETAILED DESCRIPTION OF ILLUSTRATIVE EMBODIMENTS

Figure 11:
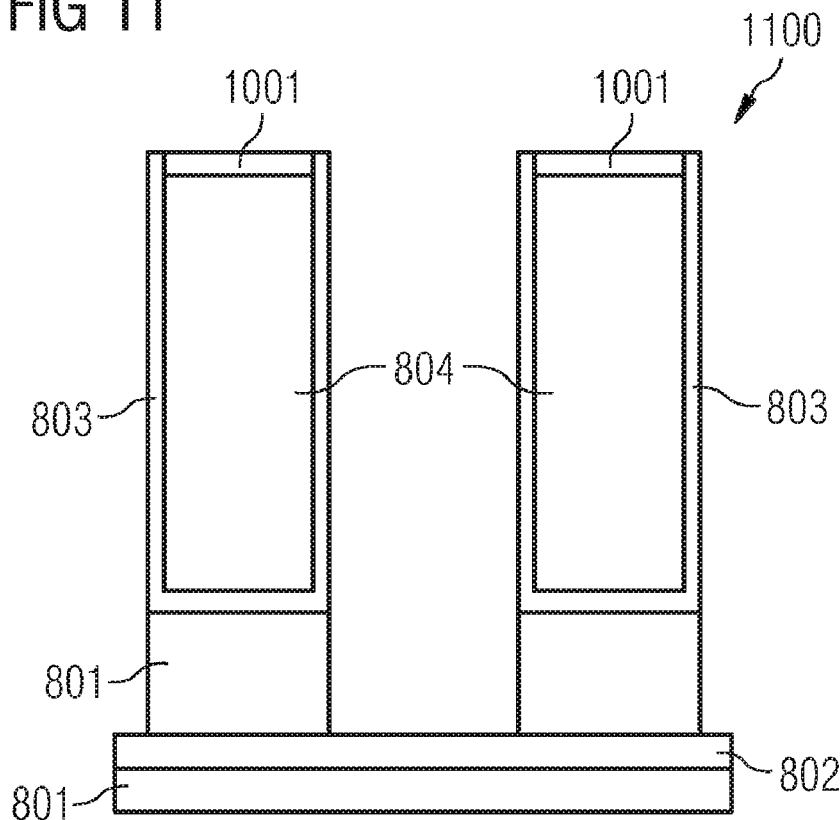
FIG. 11 shows a layer sequence at a fourth point in time during a method for manufacturing a layer arrangement in accordance with the second exemplary embodiment of the invention.

Identical or similar components in different figures are provided with identical reference numerals.

A description is given below, referring to FIG. 1 to FIG. 7, of a method for producing a layer arrangement in accordance with a first exemplary embodiment of the invention.

In order to obtain the layer sequence 100 shown in FIG. 1, trenches are formed on a dielectric substrate 101 (for example composed of silicon oxide material) using a lithography method and an etching method. Copper material is deposited on the layer sequence thus obtained. Material of the deposited copper layer is etched back using a CMP method ("chemical mechanical polishing"), whereby copper interconnects 102 are formed in the trenches. The copper interconnects 102 are therefore produced according to the damascene principle. A diffusion barrier (for example composed of TaN/Ta) not shown in FIG. 1 may be formed between a respective copper interconnect 102 and the substrate 101. A barrier layer may furthermore be formed on the top side of the copper material.

In order to obtain the layer sequence 200 shown in FIG. 2, material of the dielectric substrate 101 is removed using an etching method such that trenches 201 are formed between adjacent copper interconnects 102. In the etching method, etching is effected until material of the substrate 101 has not only been removed between the interconnects 102, rather the trenches 201 project deeper into the substrate 101 than the copper interconnects 102. To put it another way, the dielectric material of the substrate 101 is etched back using the metal tracks 102 as a mask. The trenches 201 extend deep into the silicon oxide substrate 101, whereby an architecture having a low value of the dielectric constant is obtained. Material of the dielectric 101 is etched back using the metal tracks 102 as a mask, the etching stop preferably lying below the lower edge of the metal tracks 102. The copper interconnects 102 have a width b of typically 100 nm to 300 nm or less, and have, for example, an aspect ratio of typically one to two.

In order to obtain the layer sequence 300 shown in FIG. 3, a non-conformal electrically insulating layer 301 composed of silane-based silicon oxide is deposited on the copper interconnects 102, whereby a buffer layer 301 is formed on the free-standing metal tracks 102. The non-conformal electrically insulating layer 301 has a thickness which is not constant over the layer sequence and which is typically between 0% and 100% of the vertical height of the copper interconnects 102 in an upper region d. Care must be taken to ensure that the material-free regions between adjacent interconnects 102 (later air gaps) are not completely closed during the formation of the non-conformal electrically insulating layer 301. The material of the non-conformal electrically insulating layer 301 is chosen such that it is a good support for the later deposition of ozone-based TEOS material used as a later cover layer.

In order to obtain the layer sequence 400 shown in FIG. 4, a thin conformal electrically insulating layer 401 having a thickness l of between typically 5 nm and 30 nm is deposited from modified TEOS. The material of the electrically insulating layer 401 is chosen such that ozone-based TEOS cannot grow, or can grow only very poorly, thereon. The material of the conformal electrically insulating layer 401 is formed using a plasma-enhanced chemical vapor deposition method and constitutes a silicon-oxygen-nitrogen-containing material, in which case, during the PECVD method, silicon material and oxygen material and nitrogen material are supplied using an organic silicon precursor material, namely tetraethyl orthosilicate.

As an alternative, silicon nitride may be used as material for the conformal electrically insulating layer 401; ozone-based TEOS can advantageously likewise be deposited only poorly on said silicon nitride.

In order to obtain the layer sequence 500 shown in FIG. 5, photoresist material 501 is deposited on the layer sequence 400 in such a way that the trenches 201 are filled. To put it another way, a layer of photoresist 501 is applied which is also intended to penetrate into the interspaces 201 between the later air gaps. The photoresist 501 is firstly deposited with a sufficient thickness and is subsequently etched back until the top side of the dielectric 401 is uncovered, that is to say until a partial region of the conformal electrically insulating layer 401 has been uncovered.

In order to obtain the layer sequence 600 shown in FIG. 6, material of the conformal electrically insulating layer 401 that is not covered by photoresist 501 is removed by means of etching. The etched-back layer composed of photoresist 501 protects the component of the layer 401 within the later air gaps against removal during this etching step.

In order to obtain the layer sequence 700 shown in FIG. 7, the rest of the photoresist 501 is removed by means of an etching method. An electrically insulating cover layer 701 composed of ozone-based TEOS is subsequently formed using a selective deposition method, which cover layer closes off regions between adjacent interconnects 102 and therefore forms air gaps 702. On account of the material selection and the preceding processes, the ozone-based TEOS 701 grows only above the metal track 102 on the non-conformal electrically insulating layer 301, whereas it does not grow on the conformal electrically insulating layer 401.

The selective deposition according to the invention avoids tips of the air gaps 702 which could project right into the next metal level and could therefore disturb the functionality of an integrated circuit.

A description is given below, referring to FIG. 8 to FIG. 12, of a method for producing a layer arrangement in accordance with a second exemplary embodiment of the invention.

It should be pointed out in this connection that the methods described in accordance with all the exemplary embodiments exhibit a self-aligning process and therefore manage without an additional lithographic level during the formation of air gaps. As a result, the process is less expensive, and an extremely difficult alignment of lithography levels of air gaps is dispensable.

Consequently, the methods are based on the selective deposition of a dielectric and an associated formation of air gaps.

One very important advantage is the particularly great reduction of the k value since a spacer between a metallic structure as interconnect and an air gap can be provided in particularly thin fashion. One important aspect of this damascene method is the self-aligned arrangement of the air gaps and also the selective deposition on the metal track for the formation of the cavities.

In order to obtain the layer sequence 800 shown in FIG. 8, firstly a buried etching stop layer 802 preferably composed of silicon nitride ($Si_3N_4$), is formed in a substrate 801, for example, composed of silicon oxide or a low-k material. The buried etching stop layer 802 is formed from a dielectric material. Trenches are subsequently formed in the substrate 801, a barrier layer 803 (e.g. TaN/Ta) then being deposited at sidewalls of the trenches. The trenches whose walls are covered with the barrier layer 803 are subsequently filled with copper material, with the result that copper interconnects 804 are obtained.

Consequently, the initial basis of the method according to an embodiment of the invention is a standard damascene process for forming the interconnects 804 with a barrier layer 803 in a dielectric substrate 801. In the method, the formation of the etching stop layer 802 may optionally be implemented in order to predetermine a defined etching stop during a later etching method. The optional etching step in which the buried etching stop layer 802 is used as etching stop layer may be used for the targeted setting of the depth of air gaps to be formed during a later etching method. The interspace between the etching stop layer 802 and the metal interconnects 804 is optional. In other words, the metal interconnects (or the barrier layer 803) could be formed directly on the etching stop layer 802. The provision of an etching stop layer 802 arranged below the copper interconnects 804 is preferred, however, since the air gaps can thus be formed such that they extend deeper into the substrate 801 in a defined manner. The effective k value of the structure obtained can be reduced further by means of the deeper etching.

In order to obtain the layer sequence 900 shown in FIG. 9, material of the copper interconnects 804 is slightly etched back, with the result that the metal is recessed relative to the surface of the layer sequence 900 (for example $(NH_4)_2S_2O_8$).

In order to obtain the layer sequence 1000 shown in FIG. 10, the depressions formed by means of the previous removal of copper material are filled with material of a growth layer 1001, such as, for example, tantalum, tantalum nitride or titanium.

This layer is provided from a material such that material of a cover layer can be deposited thereon in a later selective growth method. Furthermore, layer 1001 serves to protect the underlying copper material of the interconnects 804 against oxidation during the subsequent $O_3$/TEOS deposition. The layer 1001 furthermore serves as a diffusion barrier for preventing diffusion of copper into the material surrounding the copper interconnects 804.

To put it another way, a cap layer barrier and seed layer 1001 is applied, on which the dielectric that is to be grown selectively grows later for the formation of the cover layer. Excess material of the barrier layer 1001 is ground away by means of a subsequent CMP method step. As an alternative, the barrier and seed layer 1001 may also be grown by selective growth onto the metal interconnect 804.

In order to obtain the layer sequence 1100 shown in FIG. 11, material of the substrate 801 is etched back by means of a selective etching method, the etching method not being suitable for etching the material of the etching stop layer 802. The etching stop layer 802 is thereby used as an etching stop layer, such that the etching front for the removal of material of the substrate 801 stops upon reaching the buried etching stop layer 802. The material of the barrier layer 803, of the copper interconnects 804 and of the growth layer 1001 is also not removed by means of the etching method.

Consequently, the dielectric 801 (composed of silicon oxide) between the interconnects 804, for the formation of later air gaps, is etched away selectively with respect to the layers 803, 1001.

As an alternative to the provision of the etching stop layer 802, the etching may also be defined according to time, whereby the depth of the etching front is determined by the temporal duration of the etching method.

Figure 12:
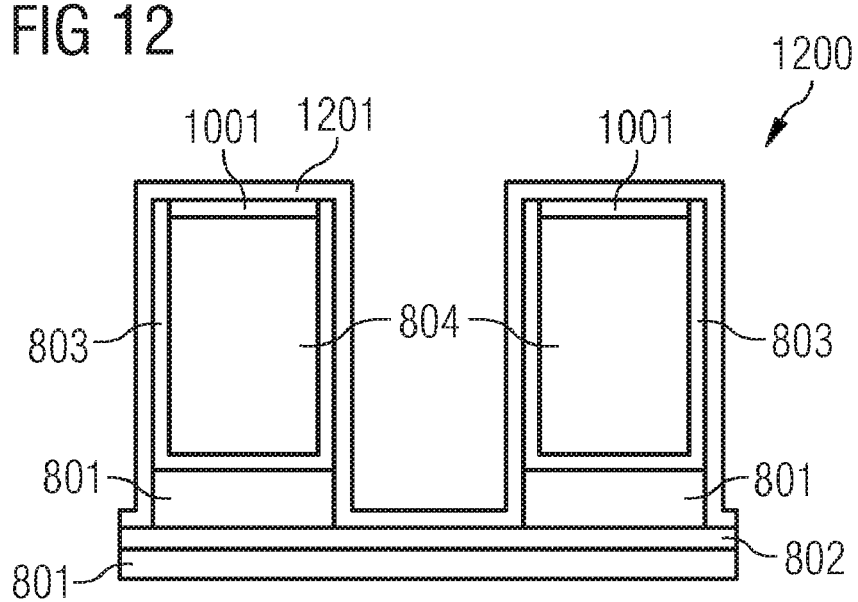
FIG. 12 shows a layer sequence at a fifth point in time during a method for manufacturing a layer arrangement in accordance with the second exemplary embodiment of the invention.

In order to obtain the layer sequence 1200 shown in FIG. 12, a protective layer 1201 composed of a material on which a later growth of a cover layer (not shown in FIG. 12) does not take place is applied to the layer sequence 1100.

Figure 13:
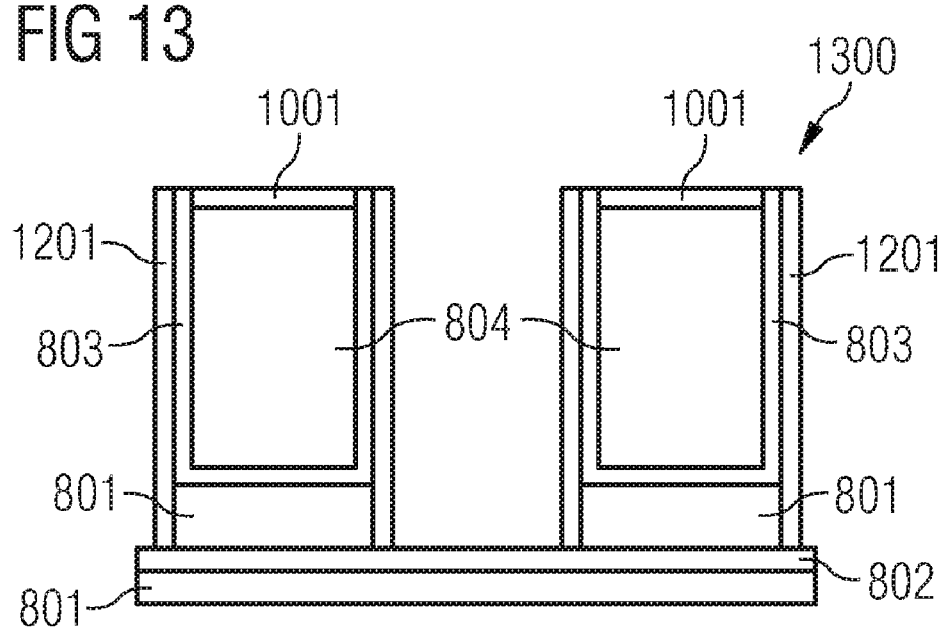
FIG. 13 shows a layer sequence at a sixth point in time during a method for manufacturing a layer arrangement in accordance with the second exemplary embodiment of the invention.

Consequently, in accordance with the exemplary embodiment shown in FIG. 13, after the CMP method step for the planarization of the layer 1001, a conformal layer of dielectric material is deposited as protective layer 1201, the selective dielectric not growing on the material of the protective layer 1201. The properties with regard to the growth capability of the selective dielectric on the barrier layer 803 are unimportant in accordance with this exemplary embodiment. Consequently, the barrier layer 803 may be provided from any desired material which is optimized for example toward preventing diffusion between material of the copper interconnects 804 and other regions of the layer sequence, whereas its growth properties with regard to the cover layer 1201 are unimportant.

In order to obtain the layer sequence 1300 shown in FIG. 13, the protective layer 1201 is subjected to a highly anisotropic etching step, with the result that only narrow spacers remain at the sidewalls of the trenches, material of the growth layer 1001 being uncovered. Although not shown in the Figures, it is possible, after obtaining the layer sequence 1300 from FIG. 13, for a cover layer to be grown on the layer sequence 1300 thus obtained, as is shown in FIG. 14 and explained in more detail below.

Figure 14:
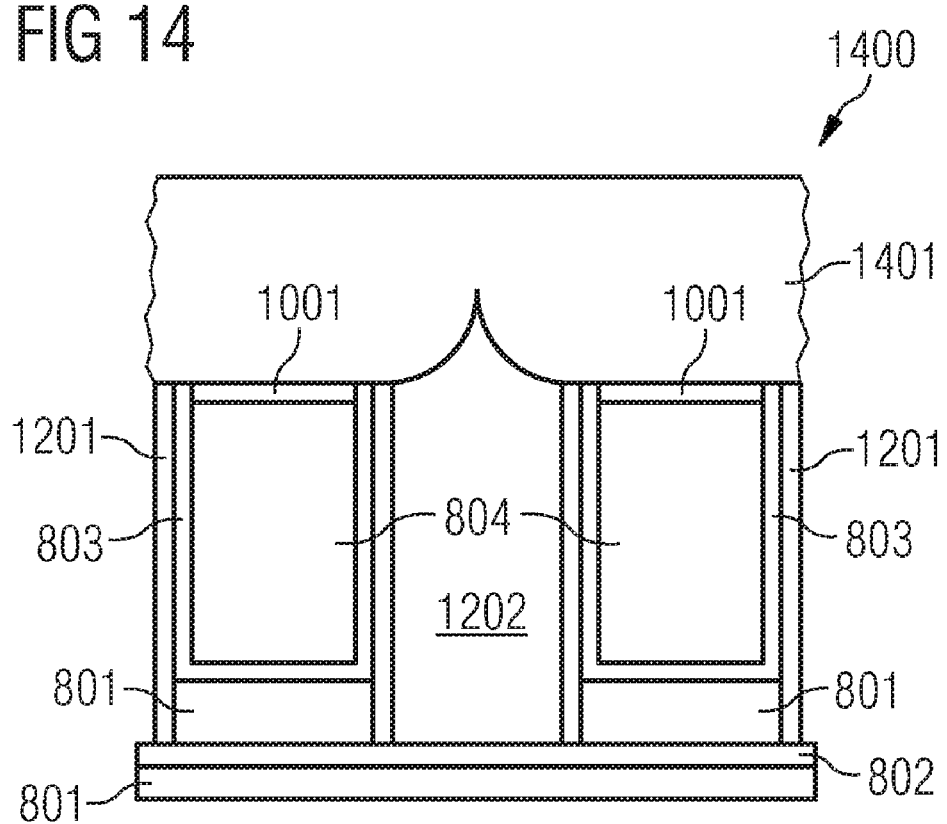
FIG. 14 shows a layer arrangement manufactured by the method in accordance with the second exemplary embodiment of the invention.

In order to obtain the layer arrangement 1400 shown in FIG. 14, an electrically insulating cover layer 1401 is grown selectively only on the material of the growth layer 1001. The cover layer 1401 does not grow on the material of the protective layer 1201, preferably silicon-oxygen-nitrogen-containing material (modified TEOS), and on the material of the substrate 801, preferably likewise silicon-oxygen-nitrogen-containing material, and, if appropriate, on the material of the etching stop layer 802, preferably silicon nitride; to put it another way, the material of the cover layer 1401 cannot be deposited on said layers 801, 802, 1201. As a result, air gaps 1202 are formed which are delimited by the etching stop layer 802 or the substrate 801, the electrically insulating cover layer 1401, and the spacers of the protective layer 1201.

The selective dielectric 1401 is thus grown, which grows on the upper barrier and seed layer 1001, but does not grow on the protective layer 1201 and does not grow on the dielectric 801 or on the etching stop layer 802.

For the planarization of the surface, a further layer of dielectric is applied, preferably at least as thick as the height of the air gaps 1202, in order to fill the regions between interconnects 804 at a great distance. The layer sequence thus obtained is then planarized by means of a CMP method.

A description is given below, referring to FIG. 15, FIG. 16, of a method for producing a layer arrangement in accordance with a third exemplary embodiment of the invention.

Figure 15:
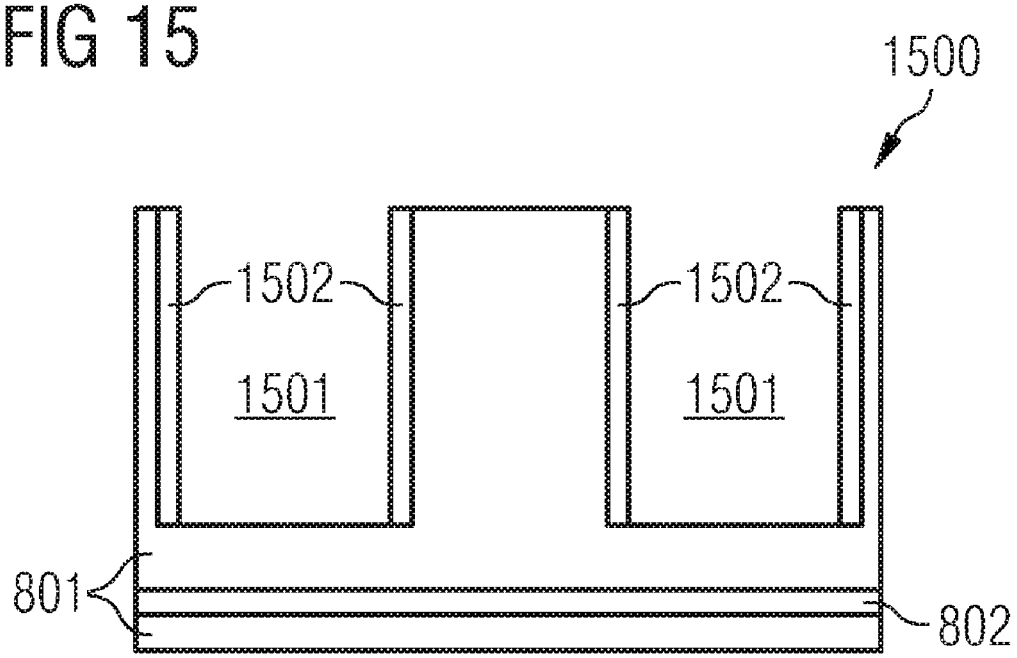
FIG. 15 shows a layer sequence at a first point in time during a method for manufacturing a layer arrangement in accordance with a third exemplary embodiment of the invention.

In order to obtain the layer sequence 1500 shown in FIG. 15, firstly a buried etching stop layer 802 is formed in a dielectric substrate 801. The substrate preferably includes silicon-oxygen-nitrogen-containing material. Trenches 1501 are subsequently formed in the substrate 801 using a lithography and etching method.

Silicon nitride spacers 1502 are formed at sidewalls of the trenches 1501 by silicon nitride material firstly being deposited over the whole area and in a largely conformal manner and said silicon nitride material subsequently being subjected to an etching method. The provision of the silicon nitride material affords better protection for the copper material of the interconnects and prevents, in particular in a later step, the growth of the cover layer 1201 at the sidewalls of the metal tracks.

Figure 16:
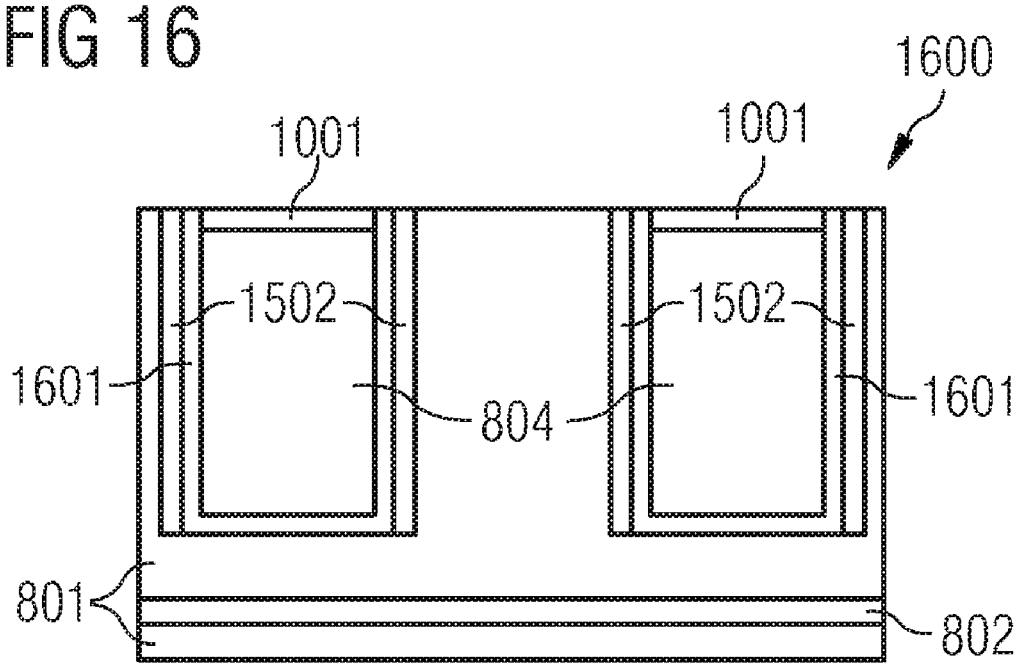
FIG. 16 shows a layer sequence at a second point in time during a method for manufacturing a layer arrangement in accordance with the third exemplary embodiment of the invention.

In order to obtain the layer sequence 1600 shown in FIG. 16, in a manner similar to that described above referring to FIG. 8 to FIG. 10, firstly a barrier layer 1601 is formed in the trench covered with the spacers 1502, said barrier layer being provided from tantalum/tantalum nitride in accordance with the exemplary embodiment described. The trenches are subsequently filled with copper material, whereby copper interconnects 804 are obtained. Then, as explained in the second exemplary embodiment, material of the copper interconnects 804 is etched back somewhat, and the depressions formed as a result are filled with tantalum material, whereby a growth layer 1001 is formed.

In accordance with the exemplary embodiment described, the silicon nitride spacers 1502 form the protective layer at which growth of a cover layer 1201 does not take place.

Figure 17:
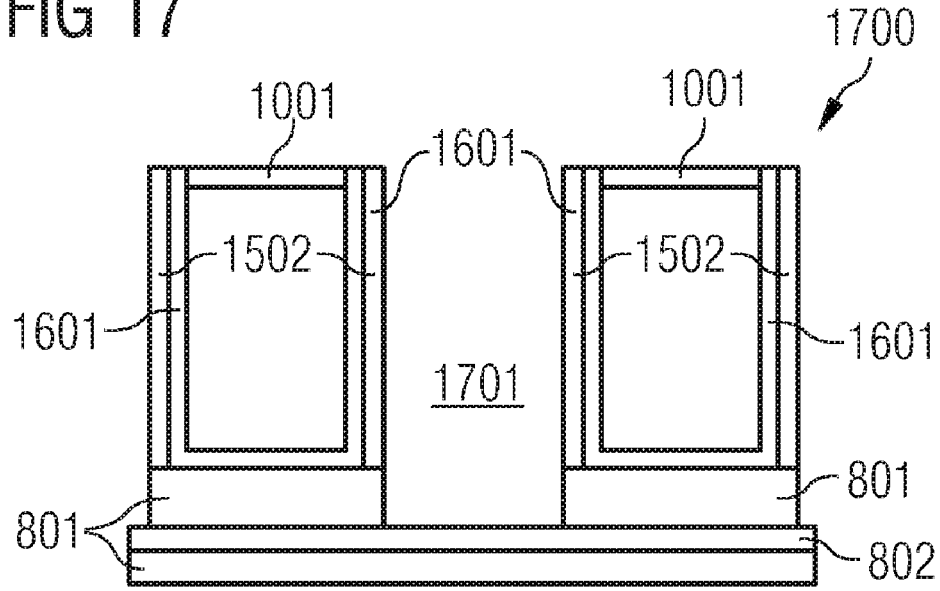
FIG. 17 shows a layer sequence at a third point in time during a method for manufacturing a layer arrangement in accordance with the third exemplary embodiment of the invention.

In order to obtain the layer sequence 1700 shown in FIG. 17, the substrate 801 is subjected to a highly anisotropic, selective etching step, with the result that only the metal tracks 804 remain, provided laterally with the silicon nitride spacers 1502 and barrier layer 1601 and provided on the top with the growth layer 1001. Substrate material 801 still remains below the copper interconnects 804, the barrier layer 1601 and the spacers 1502.

Figure 18:
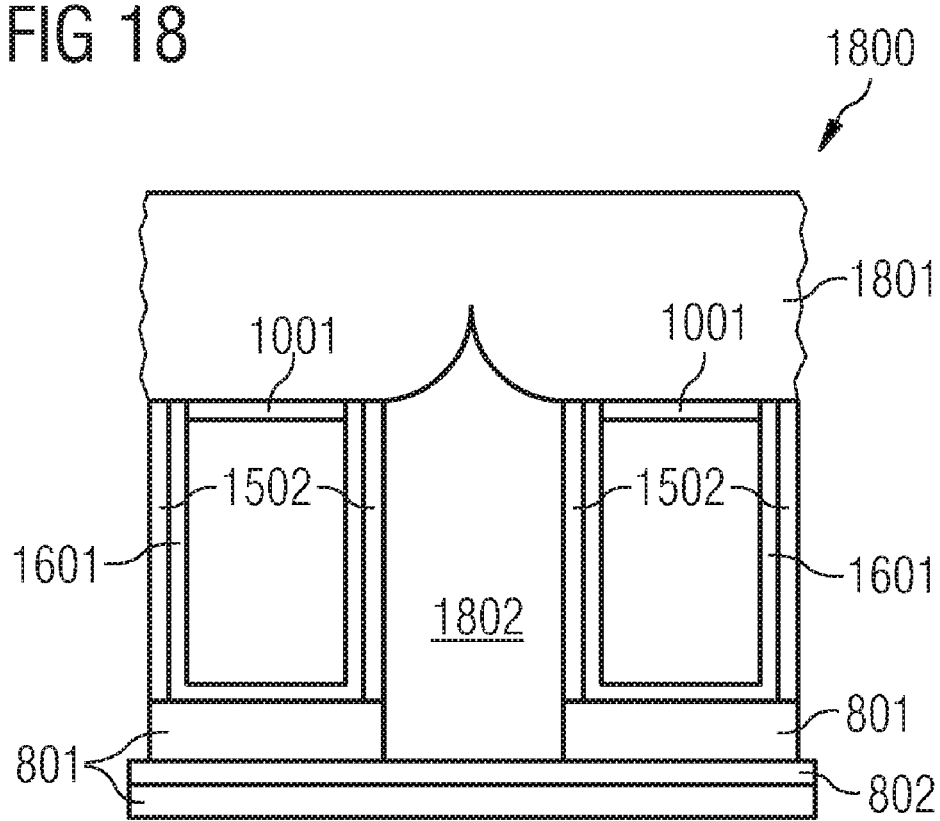
FIG. 18 shows a layer arrangement manufactured by the method in accordance with the third exemplary embodiment of the invention.

In order to obtain the layer arrangement 1800 shown in FIG. 18, an electrically insulating cover layer 1801 is grown selectively only on the material of the growth layer 1001. The cover layer 1801 does not grow on the material of the spacers 1502, preferably silicon nitride, and on the material of the substrate 1801, preferably silicon-oxygen-nitrogen-containing material, and, if appropriate, on the material of the etching stop layer 802, preferably silicon nitride; to put it another way, the material of the cover layer 1801 cannot be deposited on said layers 801, 802, 1502. As a result, air gaps 1802 are formed which are delimited by the etching stop layer 802 or the substrate 801, the electrically insulating cover layer 1801, and the spacers 1502.

The illustrations in the figures are schematic and not to scale.

What is claimed is:

1. A method for manufacturing a layer arrangement, the method comprising:
    forming electrically conductive structures embedded in a substrate;
    forming a trench by removing material of the substrate at least between adjacent electrically conductive structures;
    forming an interlayer having a convex surface on the electrically conductive structures, the interlayer being formed on top surfaces and sidewalls of the electrically conductive structures;
    forming a first layer comprising nitrogen on the interlayer, wherein the first layer is conformally formed on the interlayer;
    filling the trench with a photo resist material, the photo resist material covering portions of the first layer on the sidewalls of the electrically conductive structures;
    etching the exposed portions of the first layer to expose the interlayer;
    removing the photo resist material from the trench exposing the first layer on the sidewalls of the electrically conductive structures;
    forming a second layer comprising an insulating material on the interlayer without forming the insulating material on the exposed first layer, wherein the second layer bridges adjacent electrically conductive structures such that air gaps are formed between adjacent electrically conductive structures.

2. The method as claimed in claim 1, wherein forming the interlayer comprises performing a non-conformal deposition.

3. The method as claimed in claim 1, wherein forming the interlayer comprises forming the interlayer from silane-based silicon oxide.

4. The method as claimed in claim 1, wherein material of the substrate is removed between the electrically conductive structures in such a way that the air gaps extend into the substrate as far as below the electrically conductive structures.

5. The method as claimed in claim 1, wherein forming the first layer comprises performing a conformal deposition method.

6. The method as claimed in claim 1, wherein forming the second layer comprises forming silicon oxide on the basis of tetraethyl orthosilicate (TEOS) decomposed in an ozone-activated manner.

7. The method as claimed in claim 1, wherein forming the electrically conductive structures comprises:
    forming trenches in the substrate; and
    introducing electrically conductive material into the trenches.

8. A method for manufacturing a layer arrangement, the method comprising:
    forming electrically conductive structures embedded in a substrate;
    forming a trench by removing material of the substrate at least between adjacent electrically conductive structures;
    forming an interlayer comprising a silane based silicon oxide on the electrically conductive structures, the interlayer being formed on top surfaces and sidewalls of the electrically conductive structures;
    forming a first layer comprising nitrogen on the interlayer, wherein the first layer is conformally formed on the interlayer using plasma-enhanced chemical vapor deposition;
    filling the trench with a photo resist material, the photo resist material covering portions of the first layer on the sidewalls of the electrically conductive structures;
    etching the exposed portions of the first layer to expose the interlayer;
    removing the photo resist material from the trench exposing the first layer on the sidewalls of the electrically conductive structures; and
    growing an oxide layer comprising ozone-based TEOS by exposing the first layer and the interlayer to a selective deposition process, wherein oxide layer forms on the interlayer and on the first layer, wherein the oxide layer bridges the adjacent electrically conductive structures such that air gaps are formed between the adjacent electrically conductive structures.

9. The method as claimed in claim 1, wherein forming the first layer comprises performing a plasma-enhanced chemical vapor deposition method for forming a silicon-oxygen-nitrogen-containing material, wherein during a supply of silicon material and oxygen material, nitrogen material is supplied using an organic silicon precursor material.

10. The method as claimed in claim 9, wherein an oxygen-containing material is used as the organic silicon precursor material.

11. The method as claimed in claim 9, wherein tetraethyl orthosilicate (TEOS) is used as the organic silicon precursor material.

12. The method as claimed in claim 8, wherein forming the electrically conductive structures comprises:
    forming trenches in the substrate; and
    introducing electrically conductive material into the trenches.

13. The method as claimed in claim 8, wherein forming the interlayer comprises performing a non-conformal deposition.

14. The method as claimed in claim 8, wherein material of the substrate is removed between the electrically conductive structures in such a way that the air gaps extend into the substrate as far as below the electrically conductive structures.

15. The method as claimed in claim 8, wherein forming the first layer comprises performing a conformal deposition method.

16. The method as claimed in claim 1, wherein forming the first layer comprises forming a silicon-oxygen-nitrogen-containing material using a plasma-enhanced chemical vapor deposition, wherein during a supply of silicon material and oxygen material, nitrogen material is supplied using an organic silicon precursor material.

17. The method as claimed in claim 16, wherein an oxygen-containing material is used as the organic silicon precursor material.

18. The method as claimed in claim 17, wherein tetraethyl orthosilicate (TEOS) is used as the organic silicon precursor material.

* * * * *